United States Patent
Akiike et al.

(10) Patent No.: US 9,024,176 B2
(45) Date of Patent: May 5, 2015

(54) TRANSPARENT CONDUCTIVE ZINC OXIDE FILM, PROCESS FOR PRODUCTION THEREOF, AND USE THEREOF

(75) Inventors: Ryo Akiike, Ayase (JP); Hideto Kuramochi, Ayase (JP); Hitoshi Iigusa, Ayase (JP)

(73) Assignee: Tosoh Corporation, Yamaguchi (JP)

( * ) Notice: Subject to any disclaimer, the term of this patent is extended or adjusted under 35 U.S.C. 154(b) by 102 days.

(21) Appl. No.: 13/639,347

(22) PCT Filed: Apr. 7, 2011

(86) PCT No.: PCT/JP2011/058814
§ 371 (c)(1),
(2), (4) Date: Nov. 8, 2012

(87) PCT Pub. No.: WO2011/126074
PCT Pub. Date: Oct. 13, 2011

(65) Prior Publication Data
US 2013/0048060 A1 Feb. 28, 2013

(30) Foreign Application Priority Data

Apr. 8, 2010 (JP) ............... P2010-089285
Mar. 8, 2011 (JP) ............... P2011-049942

(51) Int. Cl.
*H01L 31/00* (2006.01)
*C23C 14/00* (2006.01)
*C23C 14/32* (2006.01)
*D06N 7/04* (2006.01)
*G11B 5/64* (2006.01)
*C23C 14/58* (2006.01)

(Continued)

(52) U.S. Cl.
CPC ..... *C23C 14/5873* (2013.01); *Y10T 428/24355* (2015.01); *C23C 14/08* (2013.01); *C23C 14/086* (2013.01); *C23C 14/34* (2013.01)

(58) Field of Classification Search
CPC ................................ H01L 31/022483
See application file for complete search history.

(56) References Cited

U.S. PATENT DOCUMENTS

2009/0134013 A1* 5/2009 Takahashi et al. ....... 204/192.15

FOREIGN PATENT DOCUMENTS

| CN | 101460425 | 6/2009 |
| CN | 101495664 | 7/2009 |
| CN | 101629284 | 1/2010 |

(Continued)

OTHER PUBLICATIONS

Takatsuka Calculations by Examiner Eli Mekhlin, 1 Page, Apr. 21, 2014.*

(Continued)

*Primary Examiner* — Eli Mekhlin
(74) *Attorney, Agent, or Firm* — Greenblum & Bernstein, P.L.C.

(57) ABSTRACT

A transparent conductive zinc oxide based film according to the present invention contains Ti, Al and Zn in such a proportion that satisfies the following formulae (1), (2) and (3) in terms of atomic ratio, and has a plurality of surface textures different in size on a surface, wherein a center-line average surface roughness Ra of the surface of the transparent conductive film is 30 nm to 200 nm, and an average value of widths of the surface textures is 100 nm to 10 μm.

$$0.001 \leq Ti/(Zn+Al+Ti) \leq 0.079 \quad (1)$$

$$0.001 \leq Al/(Zn+Al+Ti) \leq 0.079 \quad (2)$$

$$0.010 \leq (Ti+Al)/(Zn+Al+Ti) \leq 0.080 \quad (3)$$

14 Claims, 2 Drawing Sheets

(51) Int. Cl.
*C23C 14/08* (2006.01)
*C23C 14/34* (2006.01)

(56) References Cited

FOREIGN PATENT DOCUMENTS

| | | |
|---|---|---|
| JP | 9-45140 | 2/1997 |
| JP | 09045140 A * | 2/1997 |
| JP | 2005-002387 | 6/2003 |
| JP | 2003-243677 | 8/2003 |
| JP | 2003-270413 | 9/2003 |
| JP | 2009-16179 | 1/2009 |
| JP | 2009-298649 | 12/2009 |
| WO | 2003/036657 | 5/2003 |

OTHER PUBLICATIONS

Muller et al., Solar Energy, vol. 77 (2004) pp. 917-930.*

International Preliminary Report on Patentability PCT/JP2011/058814, mail date is Nov. 15, 2012.
Search report from International Application No. PCT/JP2011/058814, mail date is May 17, 2011.
Kluth O et al., "Texture etched ZnO:Al coated glass substrates for silicon based thin film solar cells", Thin Solid Films, Elsevier-Sequoia S.A. Lausanne, CH, vol. 351, No. 1-2, XP004183103, Aug. 30, 1999, pp. 247-253.
Search report from E.P.O. in EP 11765974 8, mail date is Jul. 25, 2014.
Berginski et al., J. Appl. Phys. 101.074903 (2007), "The effect of front ZnO:Al surface texture and optical transparency on efficient light trapping in silicon thin-film solar cells".
CHINA Office action in CN 201180028345.2, mail date is Jul. 3, 2014.

* cited by examiner

TRANSPARENT CONDUCTIVE ZINC OXIDE FILM, PROCESS FOR PRODUCTION THEREOF, AND USE THEREOF

TECHNICAL FIELD

The present invention relates to a transparent conductive zinc oxide based film, a method for production thereof and use thereof, and specifically a transparent conductive film having a surface shape useful as an optical device or an electron device and a method for production thereof.

BACKGROUND ART

In optical devices and electron devices such as a solar cell, a photodiode, a flat panel display (FPD) and a light-emitting diode (LED), in order to maximally extract their characteristics, a technique for diffusing light is an essential technique, and in particular, a technique for improving light scattering ability at all wavelength regions is essential. As such an approach for scattering light, there are mainly two approaches, which are, for example, as described in Patent Literature 1:

(1) an approach for forming fine asperities (hereinafter, textures) on a surface to increase surface roughness, thereby causing optical scattering; and (2) an approach for causing scattering by a flat surface and a built-in optical scattering element.

In the case of imparting light scattering ability to a transparent conductive film, the approach (2) of the above two methods results in deterioration in electrical characteristics, in particular, increase in electrical resistance, and thus this approach is a very complicated method, when taking into consideration a process for preparing a transparent conductive film. Therefore, the approach (1) is usually used.

It has been hitherto examined to allow the surface of a transparent conductive film to have various shapes using this approach in order to improve light scattering ability. For example, in Patent Literature 2, a surface roughness has been increased by adjusting film formation conditions to accomplish a high light scattering ability. In order to exceed this, in Patent Literature 3, light scattering ability has been improved by providing fine mountain-like relieves on the surface of a transparent conductive film and forming a plurality of finer asperities on each mountain.

Recently, surface textures suitable for improving the light scattering ability of a transparent conductive film have been found, and for example, it has been reported in Non Patent Literature 1 that concave lens-like textures of a single size are formed on the surface of a thin film to thereby obtain more favorable light scattering ability than the mountain-like textures. In this method, the concave lens-like textures are formed by subjecting a transparent conductive film once formed to etching by an acid.

On the other hand, with respect to such concave lens-like textures, it has been reported in Patent Literature 1 that a plurality of lenses of several μm are prepared on the inner curved surface of a lens of several tens of μm to make it possible to further improve light scattering ability. However, in this Literature, since the textures are formed by molding on a polymer surface using a mold, it is difficult to perform microfabrication below several μm, and a base material on which the textures can be formed has been limited to polymers. Therefore, a method for more finely and complicatedly forming the concave lens-like textures on the surface of a substrate is required in order to impart a higher light scattering ability to a transparent conductive film.

Furthermore, even in the case of forming the concave lens-like textures of a single size on a transparent conductive film, it is necessary to regulate the temperature of a base plate to 300° C. or higher in order to ensure the transparency of the transparent conductive film, and thus the base plate on which the transparent conductive film is formed is limited to materials (glass, metal plate, ceramics and the like) that can withstand high temperatures. If it is possible to reduce such a film formation temperature, it enables film formation on a base plate using an organic substance such as a polymer, thereby enabling the selectivity of material of a base plate to be considerably extended.

CITATION LIST

Patent Literature

Patent Literature 1: Japanese Patent Application Laid-Open No. 2003-270413
Patent Literature 2: Japanese Patent Application Laid-Open No. 2005-002387
Patent Literature 3: International Publication No. WO 2003/036657

Non Patent Literature

Non Patent Literature 1: M. Berginski et al., J Appl Phys., 101. 074903. (2007)

SUMMARY OF INVENTION

Technical Problem

Although a moderately high light scattering ability has been obtained at the visible light region even in the conventional concave lens-like texture, it is necessary to improve light scattering ability at the near-infrared region in addition to further improving light scattering ability at the visible light region, in order to further improve the performances of the above devices. In addition, in order to remarkably extend the material selectivity, it is demanded to lower the temperature in a production process. It is further demanded for a transparent conductive film that solves these problems to hold a high durability.

In order to solve the foregoing problems, the present invention aims to provide a transparent conductive zinc oxide based film that can lower the temperature in a production process while precisely controlling fine structures of surface textures and accomplishing a high light scattering ability and a high durability, and a method for production thereof and use thereof.

Solution to Problem

The present inventors have intensively studied about the above problems, and as a result, have reached the present invention. That is, the present invention is as follows.

(1) A transparent conductive zinc oxide based film containing Ti, Al and Zn in such a proportion that satisfies the following formulae (1), (2) and (3) in terms of atomic ratio, and having a plurality of surface textures different in size on a surface, wherein a center-line average surface roughness Ra of the surface is 30 nm to 200 nm, and an average value of widths of the surface textures is 100 nm to 10 μm.

$$0.001 \leq Ti/(Zn+Al+Ti) \leq 0.079 \quad (1)$$

$$0.001 \leq Al/(Zn+Al+Ti) \leq 0.079 \quad (2)$$

$$0.010 \leq (Ti+Al)/(Zn+Al+Ti) \leq 0.080 \quad (3)$$

(2) The transparent conductive film according to (1), wherein a surface area of the transparent conductive film is 101 μm² to 200 μm² per region of 10 μm×10 μm.

(3) The transparent conductive film according to (1) or (2), wherein a shape of the surface textures is a concave lens-like shape.

(4) The transparent conductive film according to any one of (1) to (3), wherein a shape of the surface textures is a concave lens-like shape, an average value of ratios of widths of the surface textures to depths of the surface textures is 1 to 5, and at least part of the plurality of surface textures share a boundary with each other and are randomly arranged.

(5) The transparent conductive film according to (3) or (4), wherein the surface textures comprise first textures having a concave lens-like shape and second textures having a concave lens-like shape, the second textures are present inside the first textures, an average value of widths of the second textures is smaller than an average value of widths of the first textures, and an average value of the ratios of the widths of the surface textures to the depths of the surface textures is 1 to 5.

(6) A method for producing of the transparent conductive film according to any one of (1) to (5) described above, comprising a step of forming a film on a heated base material by a sputtering method using a zinc oxide based target containing Ti, Al and Zn in such a proportion that satisfies the following formulae (1), (2) and (3) in terms of atomic ratio, and a step of subjecting a surface of the formed film to a surface treatment, $$0.001 \leq Ti/(Zn+Al+Ti) \leq 0.079 \quad (1)$$

$$0.001 \leq Al/(Zn+Al+Ti) \leq 0.079 \quad (2)$$

$$0.010 \leq (Ti+Al)/(Zn+Al+Ti) \leq 0.080 \quad (3)$$

(7) The method for production according to (6), wherein a temperature of the heated base material is 250° C. or lower.

(8) The method for production according to (6) or (7), wherein the surface treatment is wet etching using an acid whose hydrogen ion concentration is 0.001 to 0.20 mol/l.

(9) A substrate having a base material, and the transparent conductive film according to any one of (1) to (5) described above arranged on the base material.

(10) An electron device or optical device comprising the substrate according to (9) described above.

(11) A photoelectric conversion device comprising the substrate according to (9) described above.

(12) A solar cell having the transparent conductive film according to any one of (1) to (5) described above.

Advantageous Effects of Invention

According to the present invention, it is possible to obtain a transparent conductive film having a specified surface shape, thereby making it possible to impart a high light scattering ability at a wide wavelength region (for example, the visible light region and the near-infrared region). Accordingly, the present invention can be variously applied to optical devices or electron devices such as a solar cell, a photodiode and an FPD backlight diffuser. In addition, since the present invention can obtain a transparent conductive film even by forming a film at the base material temperature of 200° C. or lower, the present invention can also be applied to a flexible base plate on which a film is required to be formed at a low temperature, to thereby make it possible to remarkably extend the material selectivity. Furthermore, the present invention can obtain the above effects while keeping the durability of the transparent conductive film high.

DESCRIPTION OF EMBODIMENTS

Figure 1:
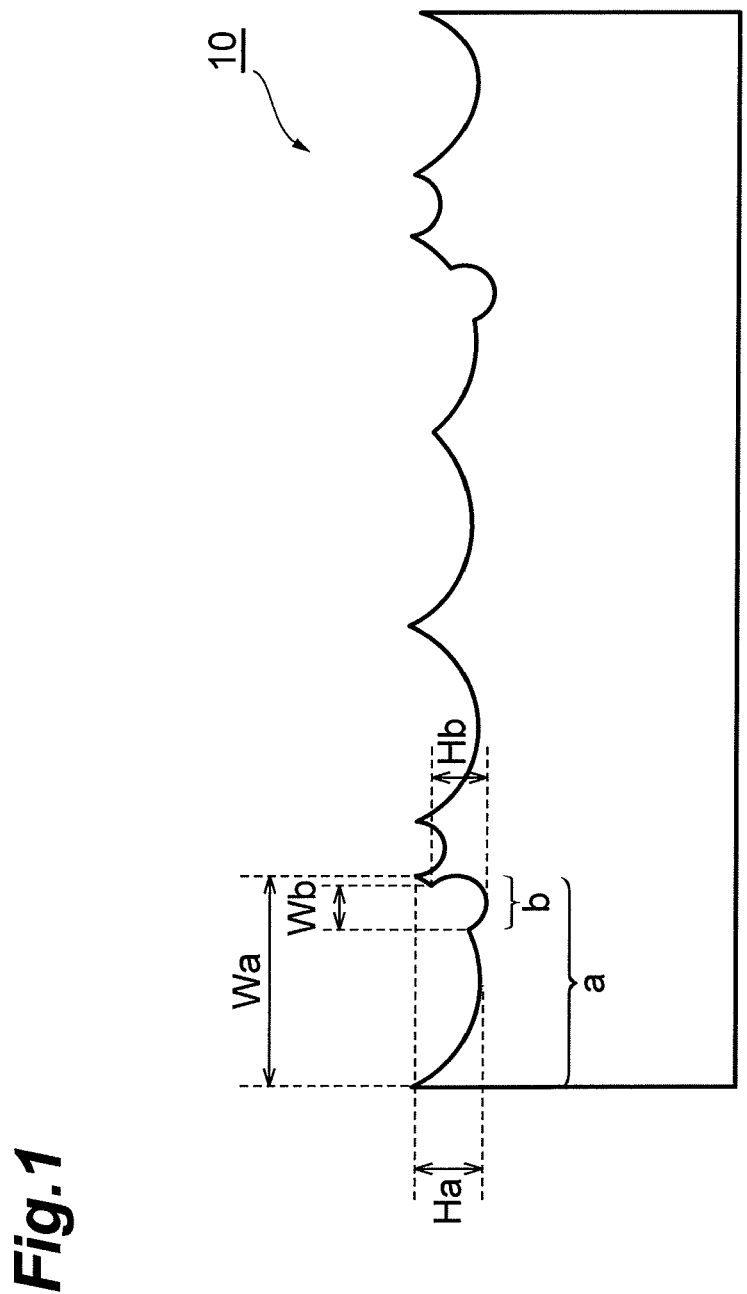
FIG. 1 is a schematic view of a cross section of a transparent conductive film according to the present embodiment.

Hereinafter, a detail of an embodiment of the present invention will be described. A transparent conductive film according to the present embodiment (transparent conductive zinc oxide based film) has a specified composition and surface shape, and contains Ti and Al in a predetermined proportion in terms of atomic ratio, wherein a center-line average surface roughness Ra is 30 nm or more and 200 nm or less, the transparent conductive film has textures different in size on the surface, and the average value of the widths of the textures is 100 nm to 10 µm. In the present embodiment, it is possible to adjust the sheet resistance of the transparent conductive film to 100Ω/□ or less. Herein, the "Ω/□" means "ohm/square". In the present embodiment, it is possible to adjust the average transmittance of the transparent conductive film at a film thickness of 1 µm to 50% or more at wavelengths of 400 nm to 800 nm.

The transparent conductive film according to the present embodiment contains Ti, Al and Zn in such a proportion that satisfies the following formulae (1), (2) and (3) in terms of atomic ratio.

$$0.001 \leq Al/(Zn+Al+Ti) \leq 0.079 \quad (1)$$

$$0.001 \leq Ti/(Zn+Al+Ti) \leq 0.079 \quad (2)$$

$$0.010 \leq (Ti+Al)/(Zn+Al+Ti) \leq 0.080 \quad (3)$$

If Al/(Zn+Al+Ti) in the above formula (1) is less than 0.001, the resistance of the film remarkably rises and also, any textures exhibiting a high light scattering ability cannot be obtained. If Al/(Zn+Al+Ti) in the above formula (1) exceeds 0.079, the resistance of the film increases, and any textures exhibiting a high light scattering ability cannot be obtained. If Ti/(Zn+Al+Ti) in the above formula (2) is less than 0.001, weatherability remarkably deteriorates and also, any textures exhibiting a high light scattering ability cannot be obtained when producing the film at a low temperature. If Ti/(Zn+Al+Ti) in the above formula (2) exceeds 0.079, the resistance of the film remarkably increases, and any textures exhibiting a high light scattering ability cannot be obtained. If (Ti+Al)/(Zn+Al+Ti) in the above formula (3) is less than 0.010, the resistance of the film rises, and any textures exhibiting a high light scattering ability cannot be obtained. If (Ti+Al)/(Zn+Al+Ti) in the above formula (3) exceeds 0.080, the resistance of the film rises and also, any textures exhibiting a high light scattering ability cannot be formed.

It is preferable that the transparent conductive film according to the present embodiment contain Ti, Al and Zn in such a proportion that satisfies the following formulae (4) and (5) in terms of atomic ratio.

$$0.006 \leq Al/(Zn+Al+Ti) \leq 0.040 \quad (4)$$

$$0.006 \leq Ti/(Zn+Al+Ti) \leq 0.040 \quad (5)$$

It is more preferable that the transparent conductive film according to the present embodiment contain Ti, Al and Zn in such a proportion that satisfies the following formulae (6) and (7) in terms of atomic ratio.

$$0.010 \leq Al/(Zn+Al+Ti) \leq 0.020 \quad (6)$$

$$0.010 \leq Ti/(Zn+Al+Ti) \leq 0.020 \quad (7)$$

The transparent conductive film according to the present embodiment has a plurality of textures (surface textures) different in size on the surface of the transparent conductive film. Herein, the "textures" mean the fine asperities of the surface as described above, and the shape of the textures is not particularly limited and examples of the shape includes a concave lens-like shape, a V-shaped recessed part, a mountain-shaped convex part and a spike-like shape. The "size" of the texture means the depth and width of a concave part, and the height and width of a convex part.

In the present embodiment, the average value of the widths of the textures is 100 nm to 10 μm, preferably 200 nm to 5 μm, and more preferably 300 nm to 3 μm. If the average value of the widths of the textures is less than 100 nm, sufficient light scattering ability cannot be achieved. If the average value of the widths of the textures exceeds 10 μm, the flatness of the film is too high, and light scattering ability deteriorates. Herein, the "widths of the textures" means a value at which a distance between two parallel straight lines in contact with a texture when the two straight lines sandwich one texture is maximum. The "average value of the widths of the textures" is that obtained by selecting an arbitrary 25-μm$^2$ section on the main surface of the transparent conductive film and determining the average of the widths of the whole textures present in the section. Herein, the "25-μm$^2$ section" is a region surrounded by a square of 5 μm×5 μm.

As in the present embodiment, the thin film on which textures different in size have been formed on the surface thereof exhibits a higher scattering ability than that of the thin film on which textures of a specified single size have been formed.

The center-line average surface roughness Ra of the surface (main surface) of the transparent conductive film according to the present embodiment is 30 nm to 200 nm, preferably 40 nm to 150 nm, and more preferably 50 nm to 150 nm. If the center-line average surface roughness Ra is less than 30 nm, the shape of the textures is not suitable for light scattering, and light scattering ability deteriorates. If the center-line average surface roughness Ra exceeds 200 nm, the shape of the textures is precipitous to thereby make it difficult for formation of a laminate film, thereby adversely affecting device characteristics.

The root mean square roughness Rms of the surface (main surface) of the transparent conductive film according to the present embodiment is not particularly limited, and is preferably 50 nm to 450 nm and more preferably 60 nm to 300 nm. If the root mean square roughness Rms is less than 50 nm, the shape of the textures is not suitable for light scattering, and light scattering ability tends to deteriorate. If the root mean square roughness Rms exceeds 450 nm, the shape of the textures is precipitous to thereby make it difficult for formation of a laminate film, thereby tending to adversely affect device characteristics.

The surface area of the transparent conductive film according to the present embodiment is preferably 101 μm$^2$ to 200 μm$^2$ and more preferably 105 μm$^2$ to 150 μm$^2$, per 100-μm$^2$ section. Herein, the "100-μm$^2$ section" is a region surrounded by a square of 10 μm×10 μm. If the surface area of the transparent conductive film exceeds 200 μm$^2$, a film with a large number of fine voids on the surface thereof is formed, and when forming a laminate film, namely, forming an upper layer film on the transparent conductive film as a lower layer film, such a phenomenon that the transparent conductive film penetrates through the upper layer film may occur and film growth may be adversely affected at the time of formation of the upper layer film formed on the transparent conductive film as the lower layer film. As a result, it may adversely affect the performances of an optical device, an electron device and the like. If the surface area of the transparent conductive film is less than 101 μm$^2$, any defined textures are not formed and light scattering ability is extremely low in some cases.

In the present embodiment, it is preferable that the shape of the textures be a concave lens-like shape. Hereinafter, concave lens-like textures (hereinafter, optionally referred to as "concave lenses") will be described in detail. The concave lens-like textures act as small lenses that deflect light passing through the transparent conductive film. The shape of the concave lens-like textures is not particularly limited, and the curved shape thereof in the depth direction is an arc-like shape, but does not necessarily need to be a completely arc-like shape. The shape of the concave lenses viewed from directly above does not need to be a completely circular shape.

In the present embodiment, the average value of the width/depth of the concave lenses is preferably 1 to 5, and more preferably 1 to 3. If the average value of the width/depth of the concave lenses is less than 1, an angle made by the curved surface of the concave lens and the base material is large to induce the total reflection at the curved surface of the concave lens and thus light scattering ability tends to deteriorate, and if the average value of the width/depth of the concave lenses exceeds 5, curvature for effectively scattering light is small and thus light scattering ability tends to deteriorate. Herein, the width/depth of the concave lenses means the ratio of the width of the concave lens to the depth of the concave lens (width of concave lens/depth of concave lens). The "depth of the concave lens" denotes the difference in height between the point located at the lowest position and the point located at the highest position in the thickness direction of the transparent conductive film, of one concave lens. The "width of the concave lens" means a value at which a distance between two straight lines when the two straight lines sandwich one concave lens (crater) is maximum. The value of the width/depth of the concave lens is one of the main factors for determining the light scattering ability that each lens has. The smaller value of the width/depth of the concave lens expresses that the lens is deeply and narrowly formed, and the larger value of the width/depth of the concave lens means that a shallow and flat lens is formed.

The surface shape and configuration of the transparent conductive film according to the present embodiment is schematically described with reference to FIG. 1. In a transparent conductive film 10 according to the present embodiment, as illustrated in FIG. 1, a plurality of concave lens-like textures share a boundary with each other and are randomly arranged on the surface of the film. In this case, further improvement in light scattering ability can be expected. Herein, the "sharing a boundary" means that the profile of one lens is in contact with the profile of the adjacent lens at one or more points. The "randomly arranged" means that the concave lenses are arranged without a particular regularity. Herein, with respect to the plurality of concave lens-like textures, it is preferable that at least part of the textures share a boundary with each other and are randomly arranged, and the textures may include textures without a boundary shared with their adjacent textures and textures arranged according to a particular regularity. It is preferable that the proportion of the total surface area of these concave lens-like textures to the surface area of the main surface of the transparent conductive film be 90% or more. Herein, it is more preferable that all the plurality of the concave lens-like textures share a boundary with each other and are randomly arranged.

In order to further improve light scattering ability, it is preferable that the concave lens-like textures comprises first textures having a concave lens-like shape (hereinafter, referred to as "concave lens-like textures (a)") and second textures having a concave lens-like shape (hereinafter, referred to as "concave lens-like textures (b)") present inside (interior curved surface) the concave lens-like textures (a). It is preferable that one or more concave lens-like textures (b) be present on the film surface, and a plurality of the textures (b) may be present inside one concave lens-like texture (a). Furthermore, it is preferable that the transparent conductive film according to the present embodiment have a configuration in which the end of one concave lens-like texture (a) or concave lens-like texture (b) shares a boundary with other concave lens-like texture (a) or concave lens-like texture (b).

The average value of the widths (lens widths, Wb in FIG. 1) of the concave lens-like textures (b) present inside the concave lens-like textures (a) is preferably smaller than the average value of the widths (lens widths, Wa in FIG. 1) of the concave lens-like textures (a), and more preferably 80% or less to the average value of the widths of the concave lens-like textures (a). If the average value of the widths of the concave lens-like textures (b) exceeds 80% to the average value of the widths of the concave lens-like textures (a), the complexity of the textures deteriorates and thus light scattering ability tends to deteriorate.

It is preferable that the average value of the width/depth of the concave lenses (concave lens-like textures (a), (b)) formed on the film surface be 1 to 5. If the average value of the width/depth of the concave lenses exceeds 5, curvature for effectively scattering light is small and thus light scattering ability tends to deteriorate. If the average value of the width/depth of the concave lenses is less than 1, an angle made by the curved surface of the concave lens and the base material is large to induce the total reflection at the curved surface of the concave lens and thus light scattering ability tends to deteriorate. Herein, the depths of the concave lens-like textures (a), (b) are Ha, Hb as represented in FIG. 1.

When various concave lenses in size share a boundary with each other and are randomly arranged to configure surface textures, further improvement in light scattering ability can be expected.

The total number of the concave lens-like textures (a), (b) formed on the film surface is preferably $1.0 \times 10^6$ to $5.0 \times 10^6$ textures/mm$^2$, and more preferably $2.0 \times 10^6$ to $4.0 \times 10^6$ textures/mm$^2$, in total. With respect to the proportion of the concave lens-like textures (a), (b) in number, it is preferable that the proportion of the concave lens-like textures (a) be 10 to 80% and that of the concave lens-like textures (b) be 90 to 20%, and it is more preferable that that of the concave lens-like textures (a) be 30 to 70% and that of the concave lens-like textures (b) be 70 to 30%. It is to be noted that the total "the proportion of the concave lens-like textures (a)+the proportion of the concave lens-like textures (b)" is 100%.

If the total number of the concave lens-like textures (a), (b) is less than $1.0 \times 10^6$ textures/mm$^2$, the complexity of the shape of the surface textures deteriorates and thus light scattering ability tends to deteriorate. If the total number of the concave lens-like textures (a), (b) exceeds $5.0 \times 10^6$ textures/mm$^2$, the size of each texture is small and light scattering ability tends to deteriorate. Furthermore, if the proportion of the concave lens-like textures (a), (b) is lopsided (the case where the proportion of the concave lens-like textures (a) does not satisfy 10 to 80%, or the case where the proportion of the concave lens-like textures (b) does not satisfy 90 to 20%), the complexity of the shape of the surface texture deteriorates and thus light scattering ability tends to deteriorate.

In the present embodiment, the surface shape can be measured by the method described below. That is, the film surface is observed by a scanning electron microscope (SEM), an atomic force microscope (AFM) or a transmission electron microscope (TEM), and the obtained observation photograph can be used to analyze the widths and depths of the concave lenses, and the shape of the textures of the film surface, and to determine the number of the concave lenses formed on the surface, the concave lens size distribution, the surface roughness and the surface area.

In the present embodiment, a haze rate (H) is used as a parameter for evaluating light scattering ability. The haze rate expresses an amount of light scattered by a sample to be evaluated, of transmitted light through the sample, and the higher haze rate means that the light scattering ability of the relevant substance is high. The haze rate is generally used as a parameter for evaluating light scattering. Herein, the haze rate is defined as follows by using the transmittance (Ta) and scattering transmittance (Td) of the sample.

$$H(\%) = (Td(\%)/Ta(\%)) \times 100$$

The haze rate of the thin film obtained in the present embodiment (average value at wavelengths of 400 nm to 600 nm) is preferably 40% or more, and more preferably 60% or more. The haze rate of the thin film obtained in the present embodiment may reach 90% or more (average value at wavelengths of 400 nm to 600 nm). In the thin film obtained in the present embodiment, it is preferable that the average value of the haze rates at 400 nm to 600 nm be 90% or more and the average value of the haze rates at 600 nm to 1000 nm be 50% or more.

In the case of using the transparent conductive film for an optical device, an electron device and the like, the durability of the transparent conductive film is one of the important factors in determining the lifetime of the device. Therefore, from the viewpoint of extension in lifetime, it is preferable that the transparent conductive film has a high durability. The durability can be evaluated by the method described below. That is, a specimen is continuously exposed to an environment of a temperature of 85° C. and a relative humidity of 85% for 1000 hours to observe a change in resistivity. At this time, when the resistivity before testing is defined as A and the resistivity after testing is defined as B, the value of (B−A)/A can be determined in terms of percentage unit to be defined as an index of the durability. Usually, the value tends to increase over testing time, and the smaller value indicates that the durability is more excellent.

Then, a method for producing the transparent conductive film according to the present embodiment will be described. The method for producing the transparent conductive film according to the present embodiment comprises a film formation step of forming a transparent conductive zinc oxide based film on a heated base material (for example, base plate) by a sputtering method using a zinc oxide based target, and a surface treatment step of subjecting the surface of the formed film to a surface treatment. In the present embodiment, a transparent conductive film formed on a base material can be obtained and at the same time, a substrate having a base material, and the transparent conductive film arranged on the base material can be obtained.

First, a method for forming a transparent conductive film in the film formation step will be described. In the present embodiment, a zinc oxide based target containing Ti, Al and Zn in such a proportion that satisfies the above formulae (1), (2) and (3) is used, and this target preferably contains Ti, Al and Zn in such a proportion that satisfies the following formulae (4) and (5) in terms of atomic ratio.

$$0.006 \leq Al/(Zn+Al+Ti) \leq 0.040 \tag{4}$$

$$0.006 \leq Ti/(Zn+Al+Ti) \leq 0.040 \tag{5}$$

This target more preferably contains Ti, Al and Zn in such a proportion that satisfies the following formulae (6) and (7) in terms of atomic ratio.

$$0.010 \leq Al/(Zn+Al+Ti) \leq 0.020 \quad (6)$$

$$0.010 \leq Ti/(Zn+Al+Ti) \leq 0.020 \quad (7)$$

Such a target can be configured by using a sintered body obtained by mixing, molding and sintering a raw material powder having such a composition.

As a method for forming a conductive thin film (transparent conductive film), it is preferable to use a sputtering method and in particular, it is more preferable to use a DC magnetron sputtering method. In order to form the surface textures by the surface treatment in the surface treatment step described later, it is preferable that the crystal structure of a thin film be oriented to (002) plane in the hexagonal system. Accordingly, it is preferable to form a film by a sputtering method in which the thin film oriented to (002) plane is relatively easily obtained.

With respect to forming the conductive thin film on a heated base material by a sputtering method, and the temperature of the base material is not particularly limited. The temperature of the base material is preferably 250° C. or lower, and more preferably 50° C. to 200° C. With respect to a conventional transparent conductive zinc oxide based film which does not contain Ti and to which only Al is added in a small amount, a film sufficiently oriented to (002) plane cannot be obtained unless the base material is heated to 300° C. or higher at the time of film formation, and the above concave lens-like textures were not able to be obtained even if the surface treatment was performed. In contrast, in the present embodiment that relates to a transparent conductive zinc oxide based film containing Ti and Al, by the surface treatment, it is possible to form a transparent conductive film having a light scattering ability equal to or higher than a conventional conductive thin film formed at such a high temperature that the base material temperature is 300° C. or higher even when forming the film at a base material temperature of 250° C. or lower.

The film formation is usually performed under an Ar atmosphere condition of an $O_2$ partial pressure of 1% or less, preferably 0.1% or less. If the $O_2$ partial pressure exceeds 1%, it tends to be difficult to obtain a desired texture.

The sputtering pressure is preferably 0.2 to 1.0 Pa, and more preferably 0.2 to 0.6 Pa. By performing the film formation within such pressure range using a zinc oxide target with Ti and Al added, the film oriented to (002) plane is easily obtained. If the sputtering pressure exceeds 1.0 Pa, orientation tends to be inferior and thus it tends to be difficult to obtain a desired surface texture. If the sputtering pressure is less than 0.2 Pa, the number of the concave lenses formed by the surface treatment tends to remarkably decrease, thereby causing light scattering ability to deteriorate in some cases.

The base material for use in the present embodiment is not particularly limited. For example, it is possible to form a conductive thin film on an inorganic base material made of metals such as aluminum, copper and stainless steel; ceramics such as alumina, titania and silicon carbide; glass, or the like, to thereby obtain a substrate. Also, since the film formation temperature can be set to 250° C. or lower in the present embodiment, it is possible to form a conductive thin film on an organic base material made of PET (polyethylene terephthalate), PEN (polyethylene naphthalate), PES (polyether sulfone), COP (cycloolefin polymer), polyimide, a TAC (triacetylcellulose) film, an acrylic film, or the like, to thereby obtain a substrate. Herein, the "substrate" means a base material on which a thin film has been formed.

For the surface treatment to which the surface of the formed film is subjected in the surface treatment step, it is possible to suitably use dry etching, wet etching and the like, and wet etching is preferable. In the wet etching, it is possible to use as an etching liquid, acids such as inorganic acids (sulfuric acid, hydrochloric acid, nitric acid, phosphoric acid and the like) and organic acids (acetic acid, oxalic acid, butyric acid, citric acid and the like), alkalis (hydroxides of alkali metals, hydroxides of alkali earth metals, and the like), or mixtures of various acids or mixtures of various alkalis. The etching liquid may be brought into contact with the film surface. Among the above etching liquids, it is preferable to use an acid whose hydrogen ion concentration is 0.001 to 0.20 mol/l, and it is more preferable to use hydrochloric acid as an acid. Hydrochloric acid is preferable because the size of the chloride ion of the hydrochloric acid is smaller than anions of other acids (for example, nitric acid, sulfuric acid and acetic acid).

In the case of using hydrochloric acid as the etching liquid, the liquid temperature of the etching liquid can be set from room temperature to a temperature lower than the boiling point of hydrochloric acid. It is preferable that the liquid temperature of the etching liquid be 40° C. to 50° C. This is because the slightly higher liquid temperature makes the difference between the etching rate in the (002) plane direction and the etching rate on other crystal planes larger to thereby easily form a texture shape suitable for light scattering.

It is preferable that the etching be performed in multiple times, and it is preferable that a short time etching be repeated from the viewpoint of easily achieving a high haze rate.

If the hydrogen ion concentration of the acid exceeds 0.20 mol/l, it may be difficult to control the etching rate and may be difficult to form the concave lens-like textures (b) to be formed inside the fine concave lens-like textures (a) on the surface. If the hydrogen ion concentration of the acid is less than 0.001 mol/l, the rate of the surface treatment may remarkably lower and the productivity in a production process may be remarkably inferior.

The substrate thus obtained by the surface treatment is suitably applied to devices such as electron devices or optical devices for use in a solar cell, a photodiode, a photosensor, a flat panel display, a light-emitting diode, a liquid crystal display, a phototransduction apparatus and the like. In addition, this substrate is suitably used in a photoelectric conversion device. In the photoelectric conversion device using this substrate, since light that has reached the device is scattered by the texture structure in the present embodiment, a vertical reflection can be reduced to further increase light incident inside the device. In addition, since the incident light at this time is obliquely incident to the device, the light path length thereof is longer than the case of being vertically incident to the device. This results in making it possible to convert more light to current and to accomplish a high conversion efficiency.

EXAMPLES

Hereinafter, the present invention will be described in more detail with reference to Examples, but the present invention is not limited to these Examples.

The number of textures, transmittance and haze rate were recorded as average values by performing each Example five times. The value of the width/depth of the concave lenses shows an average value of values with respect to respective concave lenses observed by AFM, wherein the average value was that determined by selecting an arbitrary 25-μm² section and determining the average of the values of the whole concave lenses present therein. Herein, it was confirmed by an X-ray diffraction measurement that the crystal structure of the formed transparent conductive film is oriented to (002) plane in the hexagonal system. The measurement conditions are as follows: X-ray source: CuKα, output of X-ray source: 40 kV, 40 mA, and scanning rate: 1°/min.

Examples 1 to 8

As a sputtering target, one prepared by mixing and molding respective powders of ZnO, $TiO_2$ and $Al_2O_3$ so that the atomic ratio satisfied those shown in Table 1, then sintering them at 1200° C., and joining the obtained sintered body to a backing plate was used. DC magnetron sputtering was performed under the sputtering conditions of a glass base plate temperature of 200° C., an oxygen partial pressure of 0.1% or less, an argon atmosphere, a sputtering pressure of 0.4 Pa and an input power of 300 W, to thereby produce a film (transparent conductive zinc oxide based film) with a film thickness of 1 nm.

This film was immersed in hydrochloric acid (liquid temperature: 40° C.) with a hydrogen ion concentration of 0.17 mol/l for seconds and then dried once. Furthermore, the etching was performed two times for 5 seconds, that is, etching was performed for seconds in total, to thereby carry out the surface treatment (Table 2). After such etching, the surface shape was observed by SEM, TEM and AFM. The transmittance and haze rate were measured by using a spectrometer (manufactured by Hitachi High-Technologies Corporation, U-4100), and shown as average values at respective wavelength regions. The sheet resistance value was measured by using a Hall effect measurement apparatus, HL55WIN (Bio-Rad Laboratories, Inc.). The results are shown in Tables 3 and 4.

The durability of each film was examined as follows. That is, a specimen was continuously exposed to an environment of a temperature of 85° C. and a relative humidity of 85% for 1000 hours to observe a change in resistivity. At this time, when the resistivity before testing was defined as A and the resistivity after testing was defined as B, the value of (B−A)/A was determined in terms of percentage unit to be defined as an index of the durability. Usually, the value tends to increase over testing time, and the smaller value indicates that the durability is more excellent. The results are shown in Table 3, Example 9

A target was prepared by blending respective powders of ZnO, $TiO_2$ and $Al_2O_3$ so that the atomic ratio satisfied those shown in Table 1, and subjected to the same film formation, surface treatment and evaluation as in Example 1. Herein, the solution for use in etching was a mixed solution of phosphoric acid/acetic acid (1:1=mol/mol) in which the hydrogen ion concentration was 0.05 mol/l. The results are shown in Tables 3 and 4.

Example 10

A target was prepared by blending respective powders of ZnO, $TiO_2$ and $Al_2O_3$ so that the atomic ratio satisfied those shown in Table 1, and subjected to the same film formation, surface treatment and evaluation as in Example 1. Herein, the solution for use in etching was a hydrochloric acid solution in which the hydrogen ion concentration was 0.05 mol/l. The results are shown in Tables 3 and 4.

Example 11

A target was prepared by blending respective powders of ZnO, $TiO_2$ and $Al_2O_3$ so that the atomic ratio satisfied those shown in Table 1, and subjected to the same film formation, surface treatment and evaluation as in Example 1. Herein, the base plate temperature at the time of film formation was 100° C. The results are shown in Tables 3 and 4.

Example 12

A target was prepared by blending respective powders of ZnO, $TiO_2$ and $Al_2O_3$ so that the atomic ratio satisfied those shown in Table 1, and subjected to the same film formation, surface treatment and evaluation as in Example 1. Herein, in the etching method, it was immersed in the solution for 20 seconds and then dried, and the etching was repeatedly performed seven times for 5 seconds, that is, etching was performed for 55 seconds in total (20 seconds+5 seconds×7 times), to thereby carry out the surface treatment. The results are shown in Tables 3 and 4.

Example 13

A target was prepared by blending respective powders of ZnO, $TiO_2$ and $Al_2O_3$ so that the atomic ratio satisfied those shown in Table 1, and subjected to the same film formation, surface treatment and evaluation as in Example 1. Herein, the sputtering pressure was 4 Pa. The results are shown in Tables 3 and 4. In the obtained film, spike-like textures different in size were observed, and 90% of the textures fell within a range from 30 nm to 500 nm in height and from 100 nm to 1000 nm in width. With respect to the spike-like textures, the differences in height were up to 500 nm and the average of the distances between the tops of the spikes was 500 nm, and the curved surface was reduced as compared with the textures of Example 3.

Comparative Example 1

A target was prepared by blending respective powders of ZnO and $Al_2O_3$ so that the atomic ratio satisfied those shown in Table 1, and subjected to the same film formation, surface treatment and evaluation as in Example 1. The results are shown in Tables 3 and 4.

Comparative Example 2

A target was prepared by blending respective powders of ZnO and $Ga_2O_3$ so that the atomic ratio satisfied those shown in Table 1, and subjected to the same film formation, surface treatment and evaluation as in Example 1. The results are shown in Tables 3 and 4.

Comparative Example 3

A target was prepared by blending respective powders of ZnO and $Al_2O_3$ so that the atomic ratio satisfied those shown in Table 1, and subjected to the same film formation, surface treatment and evaluation as in Example 1. The results are shown in Tables 3 and 4. In the obtained film, spike-like textures different in size were observed, and 90% of the textures fell within a range from 30 nm to 350 nm in height and from 80 nm to 1000 nm in width. With respect to the spike-like textures, the differences in height were up to 350 nm and the average of the distances between the tops of the spikes was 400 nm, and the curved surface was reduced as compared with the textures of Example 3.

Comparative Example 4

A target was prepared by blending respective powders of ZnO, TiO$_2$ and Al$_2$O$_3$ so that the atomic ratio satisfied those shown in Table 1, and subjected to the same film formation, surface treatment and evaluation as in Example 1. Herein, the base plate temperature at the time of film formation was 300° C. The results are shown in Tables 3 and 4.

Comparative Examples 5 and 6

Each target was prepared by blending respective powders of ZnO, TiO$_2$ and Al$_2$O$_3$ so that the atomic ratio satisfied those shown in Table 1, and subjected to the same film formation, surface treatment and evaluation as in Example 1. The results are shown in Tables 3 and 4.

Comparative Examples 7 and 8

Each target was prepared by blending respective powders of ZnO, TiO$_2$ and Ga$_2$O$_3$ so that the atomic ratio satisfied those shown in Table 1, and subjected to the same film formation, surface treatment and evaluation as in Example 1. The results are shown in Tables 3 and 4.

(Preparation of Solar Cell)

Figure 2:
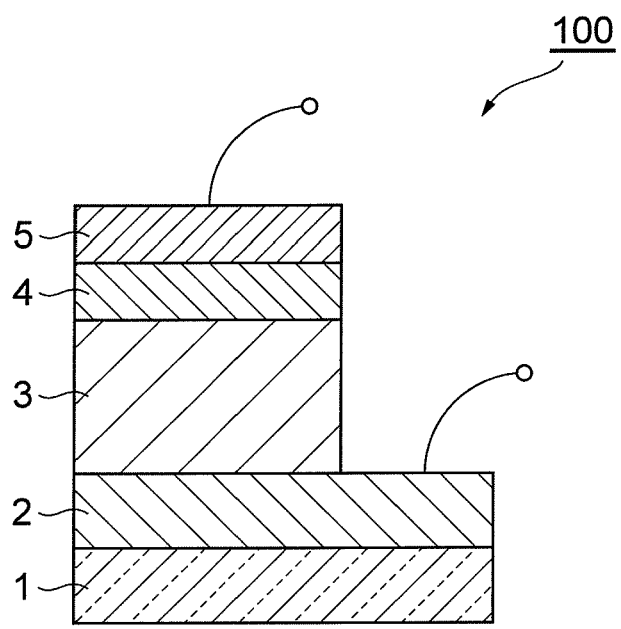
FIG. 2 is a schematic view of a solar cell prepared in Example.

A film obtained by the same film formation and surface treatment as in Examples 1, 3, 4, 5, 8, 9, 10, 11, 12 and 13, and Comparative Examples 1 to 6 was used to prepare a solar cell 100 illustrated in FIG. 2, and evaluation was performed.

That is, as a translucent insulating base plate (1), a non-alkali glass base plate with a smooth surface was used. A transparent conductive film as a surface electrode layer (2) was formed on the main surface of the translucent insulating base plate (1) by the magnetron sputtering method. Then, the surface of the surface electrode layer (2) was subjected to the surface treatment. Characteristics of the obtained transparent conductive film were the same as those shown in Tables 3 and 4.

Next, a photoelectric conversion layer (3) with a thickness of about 500 nm, having a p-i-n junction, was laminated by forming an a-Si:H film on the surface electrode layer (2) by using silane (SiH$_4$), hydrogen, diborane (B$_2$H6) or phosphine (PH$_3$) as a raw material at a base plate heating temperature of 180° C. by a plasma CVD method. Herein, the p-i-n junction was obtained by forming a p layer, an i layer and an n layer in this order. Gases of silane, hydrogen and diborane were mixed and used at the time of forming the p layer, a silane gas was used at the time of forming the i layer, and gases of silane, hydrogen and phosphine were mixed and used at the time of forming the n layer.

Next, a zinc oxide film with 2% by weight of aluminum added was formed as a barrier layer (4) by the magnetron sputtering method under an argon atmosphere of an oxygen partial pressure of 0.1% or less at a base plate heating temperature of 100° C., a sputtering pressure of 0.4 Pa and an input power of 150 W so that the thickness was 50 nm. Finally, an Ag film was formed as a rear surface electrode layer (5) using an Ag target by the magnetron sputtering method at room temperature under an argon atmosphere of an oxygen partial pressure of 0.1% or less at a sputtering pressure of 0.4 Pa and an input power of 100 W so that the thickness was about 300 nm. According to the foregoing procedure, a superstrate type thin film silicon solar cell 100 in which light is incident from the side of the translucent insulating base plate (1) was prepared.

Current-voltage characteristics when irradiating the obtained solar cell with light of AM 1.5 (100 mW/cm$^2$) by a solar simulator were measured, and a short circuit current, open voltage, fill factor and photoelectric conversion efficiency were evaluated. Each result was converted to a relative value, assuming that the value obtained by using the zinc oxide film with only aluminum added (Comparative Example 1) as the surface electrode layer (2) was defined as 1.00, as conventionally used, and shown in Table 5.

Herein, upon the light irradiation, a current at the time of short circuit of both electrodes is referred to as a short circuit current, an output voltage at the time of opening of both electrodes is referred to as an open voltage, and a value obtained by dividing the short circuit current by an effective light receiving area is referred to as a short circuit current density. The product of the short circuit current and the open voltage is a power value to be ideally extracted in this solar cell, and it is a fill factor (FF) that represents a ratio of an actually extractable power to the value. The conversion efficiency is represented by a ratio of an actually extracted power to the output of incident light (100 mW/cm$^2$) (short circuit current density×open voltage×fill factor). Therefore, the larger values of the short circuit current density, open voltage, fill factor and conversion efficiency allow the solar cell to have more excellent characteristics.

TABLE 1

| | Raw material powder Composition (atomic ratio) | | | |
|---|---|---|---|---|
| | Zn/ (Zn + M + Ti) | Element M | M/ (Zn + M + Ti) | Ti/(Zn + M + Ti) |
| Example 1 | 0.986 | Al | 0.009 | 0.005 |
| Example 2 | 0.988 | Al | 0.004 | 0.008 |
| Example 3 | 0.982 | Al | 0.008 | 0.010 |
| Example 4 | 0.966 | Al | 0.010 | 0.024 |
| Example 5 | 0.971 | Al | 0.017 | 0.012 |
| Example 6 | 0.981 | Al | 0.003 | 0.016 |
| Example 7 | 0.974 | Al | 0.007 | 0.019 |
| Example 8 | 0.945 | Al | 0.008 | 0.047 |
| Example 9 | 0.982 | Al | 0.008 | 0.010 |
| Example 10 | 0.982 | Al | 0.008 | 0.010 |
| Example 11 | 0.982 | Al | 0.008 | 0.010 |
| Example 12 | 0.982 | Al | 0.008 | 0.010 |
| Example 13 | 0.982 | Al | 0.008 | 0.010 |
| Comparative Example 1 | 0.965 | Al | 0.035 | 0.000 |
| Comparative Example 2 | 0.965 | Ga | 0.035 | 0.000 |
| Comparative Example 3 | 0.990 | Al | 0.010 | 0.000 |
| Comparative Example 4 | 0.982 | Al | 0.008 | 0.010 |
| Comparative Example 5 | 0.914 | Al | 0.058 | 0.028 |
| Comparative Example 6 | 0.913 | Al | 0.029 | 0.058 |
| Comparative Example 7 | 0.982 | Ga | 0.008 | 0.010 |
| Comparative Example 8 | 0.971 | Ga | 0.017 | 0.012 |

TABLE 2

| | Film characteristics | | | | | | Surface treatment | | |
|---|---|---|---|---|---|---|---|---|---|
| | Composition ratio (atomic ratio) | | | | | | | Hydrogen ion | Solution |
| | Zn/(Zn + M + Ti) | Element M | M/(Zn + M + Ti) | Ti/(Zn + M + Ti) | Film formation pressure (Pa) | Film formation temperature (° C.) | Type | concentration (mol/L) | temperature (° C.) |
| Example 1 | 0.984 | Al | 0.010 | 0.006 | 0.4 | 200.0 | Hydrochloric acid | 0.17 | 40 |
| Example 2 | 0.983 | Al | 0.005 | 0.012 | 0.4 | 200.0 | Hydrochloric acid | 0.17 | 40 |
| Example 3 | 0.978 | Al | 0.010 | 0.012 | 0.4 | 200.0 | Hydrochloric acid | 0.17 | 40 |
| Example 4 | 0.963 | Al | 0.011 | 0.026 | 0.4 | 200.0 | Hydrochloric acid | 0.17 | 40 |
| Example 5 | 0.968 | Al | 0.019 | 0.013 | 0.4 | 200.0 | Hydrochloric acid | 0.17 | 40 |
| Example 6 | 0.979 | Al | 0.003 | 0.018 | 0.4 | 200.0 | Hydrochloric acid | 0.17 | 40 |
| Example 7 | 0.972 | Al | 0.008 | 0.020 | 0.4 | 200.0 | Hydrochloric acid | 0.17 | 40 |
| Example 8 | 0.940 | Al | 0.010 | 0.050 | 0.4 | 200.0 | Hydrochloric acid | 0.17 | 40 |
| Example 9 | 0.978 | Al | 0.010 | 0.012 | 0.4 | 200.0 | Phosphoric acid/ Acetic acid 1:1 = mol/mol | 0.05 | 40 |
| Example 10 | 0.978 | Al | 0.010 | 0.012 | 0.4 | 200.0 | Hydrochloric acid | 0.05 | 40 |
| Example 11 | 0.978 | Al | 0.010 | 0.012 | 0.4 | 100.0 | Hydrochloric acid | 0.17 | 40 |
| Example 12 | 0.978 | Al | 0.010 | 0.012 | 0.4 | 200.0 | Hydrochloric acid | 0.17 | 40 |
| Example 13 | 0.978 | Al | 0.010 | 0.012 | 4 | 200.0 | Hydrochloric acid | 0.17 | 40 |
| Comparative Example 1 | 0.965 | Al | 0.035 | 0.000 | 0.4 | 200.0 | Hydrochloric acid | 0.17 | 40 |
| Comparative Example 2 | 0.965 | Ga | 0.035 | 0.000 | 0.4 | 200.0 | Hydrochloric acid | 0.17 | 40 |
| Comparative Example 3 | 0.980 | Al | 0.020 | 0.000 | 0.4 | 200.0 | Hydrochloric acid | 0.17 | 40 |
| Comparative Example 4 | 0.978 | Al | 0.010 | 0.012 | 0.4 | 300.0 | Hydrochloric acid | 0.17 | 40 |
| Comparative Example 5 | 0.910 | Al | 0.060 | 0.030 | 0.4 | 200.0 | Hydrochloric acid | 0.17 | 40 |
| Comparative Example 6 | 0.910 | Al | 0.030 | 0.060 | 0.4 | 200.0 | Hydrochloric acid | 0.17 | 40 |
| Comparative Example 7 | 0.978 | Ga | 0.010 | 0.012 | 0.4 | 200.0 | Hydrochloric acid | 0.17 | 40 |
| Comparative Example 8 | 0.963 | Ga | 0.011 | 0.026 | 0.4 | 200.0 | Hydrochloric acid | 0.17 | 40 |

TABLE 3

| | Haze rate (%) | | | Transmittance (%) | | |
|---|---|---|---|---|---|---|
| | 400-600 nm | 600-800 nm | 800-1000 nm | 400-600 nm | 600-800 nm | 800-1000 nm |
| Example 1 | 65 | 42 | 20 | 79 | 81 | 83 |
| Example 2 | 64 | 44 | 32 | 81 | 82 | 79 |
| Example 3 | 70 | 50 | 38 | 80 | 82 | 79 |
| Example 4 | 62 | 41 | 17 | 81 | 80 | 69 |
| Example 5 | 60 | 39 | 15 | 79 | 81 | 82 |
| Example 6 | 63 | 45 | 26 | 80 | 82 | 47 |
| Example 7 | 66 | 48 | 24 | 82 | 81 | 82 |
| Example 8 | 59 | 40 | 21 | 80 | 82 | 52 |
| Example 9 | 69 | 51 | 39 | 80 | 82 | 81 |
| Example 10 | 65 | 49 | 30 | 81 | 83 | 80 |
| Example 11 | 67 | 42 | 29 | 80 | 82 | 78 |
| Example 12 | 83 | 55 | 42 | 84 | 85 | 85 |
| Example 13 | 46 | 33 | 24 | 80 | 80 | 83 |
| Comparative Example 1 | 21 | 18 | 18 | 83 | 82 | 73 |
| Comparative Example 2 | 20 | 16 | 14 | 84 | 81 | 71 |
| Comparative Example 3 | 49 | 31 | 23 | 79 | 81 | 81 |
| Comparative Example 4 | 21 | 18 | 18 | 83 | 82 | 73 |
| Comparative Example 5 | 22 | 15 | 12 | 84 | 78 | 51 |
| Comparative Example 6 | 19 | 15 | 9 | 81 | 77 | 72 |
| Comparative Example 7 | 69 | 52 | 32 | 80 | 83 | 80 |
| Comparative Example 8 | 65 | 43 | 23 | 81 | 79 | 83 |

TABLE 4

| | Film characteristics | | | | | | |
|---|---|---|---|---|---|---|---|
| | Center-line surface roughness Ra(nm) | Root mean square roughness Rms(nm) | Surface area ($\mu m^2$/100 $\mu m^2$ section) | Sheet resistance ($\Omega/\square$) | Durability (%) | Arrangement of concave lenses | Contact strain of concave lenses |
| Example 1 | 58 | 70 | 114 | 25 | 12.3 | Random | Contacting with adjacent lens at one or more points |
| Example 2 | 59 | 72 | 117 | 7.8 | 2.8 | Random | Contacting with adjacent lens at one or more points |

TABLE 4-continued

| | | | | | | | |
|---|---|---|---|---|---|---|---|
| Example 3 | 62 | 78 | 114 | 11 | 4.3 | Random | Contacting with adjacent lens at one or more points |
| Example 4 | 56 | 68 | 115 | 14 | 3.9 | Random | Contacting with adjacent lens at one or more points |
| Example 5 | 52 | 65 | 115 | 9.4 | 7.4 | Random | Contacting with adjacent lens at one or more points |
| Example 6 | 56 | 66 | 113 | 20 | 3.0 | Random | Contacting with adjacent lens at one or more points |
| Example 7 | 62 | 75 | 116 | 13 | 4.0 | Random | Contacting with adjacent lens at one or more points |
| Example 8 | 57 | 70 | 116 | 19 | 3.0 | Random | Contacting with adjacent lens at one or more points |
| Example 9 | 63 | 77 | 114 | 13 | 4.2 | Random | Contacting with adjacent lens at one or more points |
| Example 10 | 59 | 80 | 116 | 11 | 4.1 | Random | Contacting with adjacent lens at one or more points |
| Example 11 | 60 | 84 | 115 | 7.1 | 3.1 | Random | Contacting with adjacent lens at one or more points |
| Example 12 | 88 | 125 | 107 | 23 | 4.5 | Random | Contacting with adjacent lens at one or more points |
| Example 13 | 56 | 74 | 114 | 13 | 7.4 | — | — |
| Comparative Example 1 | 15 | 31 | 105 | 2.3 | 14.9 | Random | Contacting with adjacent lens at one or more points |
| Comparative Example 2 | 13 | 26 | 107 | 4 | 40.5 | Random | Contacting with adjacent lens at one or more points |
| Comparative Example 3 | 44 | 60 | 115 | 23 | 48.2 | — | — |
| Comparative Example 4 | 11 | 24 | 108 | 3.5 | 4.0 | Random | Contacting with adjacent lens at one or more points |
| Comparative Example 5 | 13 | 25 | 104 | 12 | 32.2 | Random | Contacting with adjacent lens at one or more points |
| Comparative Example 6 | 16 | 30 | 104 | 20 | 18.3 | Random | Contacting with adjacent lens at one or more points |
| Comparative Example 7 | 65 | 73 | 111 | 9 | 47.2 | Random | Contacting with adjacent lens at one or more points |
| Comparative Example 8 | 60 | 70 | 111 | 15 | 38.3 | Random | Contacting with adjacent lens at one or more points |

| | Film characteristics | | | | | | |
|---|---|---|---|---|---|---|---|
| | Width of concave lens-like texture | | | | | Number and proportion of concave lens-like textures | |
| | Average value | Width of concave lens (a) | Width of concave lens (b) | Width/depth of concave lens | Total number (textures/mm$^2$) | Proportion of concave lenses (a) (%) | Proportion of concave lenses (b) (%) |
| Example 1 | 300 nm | 580 nm | 150 nm | 2.4 | 4.2 × 10$^6$ | 35 | 65 |
| Example 2 | 930 nm | 1200 nm | 680 nm | 3 | 3.7 × 10$^6$ | 48 | 52 |
| Example 3 | 890 nm | 1240 nm | 480 nm | 3.3 | 2.2 × 10$^6$ | 54 | 46 |
| Example 4 | 1200 nm | 1500 nm | 690 nm | 2.1 | 1.8 × 10$^6$ | 63 | 37 |
| Example 5 | 1350 nm | 1620 nm | 870 nm | 2.2 | 1.6 × 10$^6$ | 64 | 36 |
| Example 6 | 1020 nm | 1480 nm | 600 nm | 2.9 | 2.5 × 10$^6$ | 48 | 52 |
| Example 7 | 1280 nm | 1680 nm | 810 nm | 3.5 | 2.3 × 10$^6$ | 54 | 46 |
| Example 8 | 1530 nm | 1930 nm | 970 nm | 5.8 | 1.2 × 10$^6$ | 58 | 42 |
| Example 9 | 1110 nm | 1470 nm | 650 nm | 3.7 | 2.2 × 10$^6$ | 56 | 44 |
| Example 10 | 900 nm | 1290 nm | 400 nm | 3.9 | 2.3 × 10$^6$ | 56 | 44 |
| Example 11 | 420 nm | 700 nm | 190 nm | 3.4 | 2.7 × 10$^6$ | 45 | 55 |
| Example 12 | 780 nm | 1080 nm | 430 nm | 1.5 | 2.2 × 10$^6$ | 54 | 46 |
| Example 13 | 500 nm | — | — | — | — | — | — |
| Comparative Example 1 | 250 nm | 260 nm | 80 nm | 4.8 | 2.3 × 10$^5$ | 95 | 5 |
| Comparative Example 2 | 330 nm | 350 nm | 100 nm | 4.7 | 1.9 × 10$^5$ | 91 | 9 |
| Comparative Example 3 | 400 nm | — | — | — | — | — | — |
| Comparative Example 4 | 1440 nm | 1600 nm | 250 nm | 4.9 | 2.0 × 10$^5$ | 88 | 12 |
| Comparative Example 5 | 1670 nm | 1810 nm | 420 nm | 4.7 | 1.5 × 10$^5$ | 90 | 10 |
| Comparative Example 6 | 1630 nm | 1740 nm | 490 nm | 4.8 | 1.2 × 10$^5$ | 91 | 9 |
| Comparative Example 7 | 960 nm | 1420 nm | 480 nm | 3.6 | 2.4 × 10$^6$ | 51 | 49 |
| Comparative Example 8 | 860 nm | 1100 nm | 450 nm | 1.8 | 1.8 × 10$^6$ | 63 | 37 |

TABLE 5

| | Solar cell characteristics | | | |
| --- | --- | --- | --- | --- |
| | Short circuit current density Isc | Open voltage Voc | Fill factor FF | Conversion efficiency η |
| Example 1 | 1.12 | 0.99 | 1.10 | 1.12 |
| Example 3 | 1.15 | 1.00 | 1.11 | 1.16 |
| Example 4 | 1.10 | 1.00 | 1.09 | 1.10 |
| Example 5 | 1.10 | 1.00 | 1.07 | 1.09 |
| Example 8 | 1.08 | 1.00 | 1.06 | 1.07 |
| Example 9 | 1.14 | 1.00 | 1.11 | 1.14 |
| Example 10 | 1.11 | 0.99 | 1.10 | 1.11 |
| Example 11 | 1.13 | 1.00 | 1.11 | 1.13 |
| Example 12 | 1.18 | 0.99 | 1.08 | 1.16 |
| Example 13 | 1.05 | 1.00 | 1.03 | 1.04 |
| Comparative Example 1 | 1.00 | 1.00 | 1.00 | 1.00 |
| Comparative Example 2 | 0.98 | 0.99 | 1.00 | 0.97 |
| Comparative Example 3 | 1.01 | 0.99 | 0.99 | 0.99 |
| Comparative Example 4 | 0.95 | 0.99 | 0.98 | 0.92 |
| Comparative Example 5 | 0.96 | 1.00 | 1.00 | 0.96 |
| Comparative Example 6 | 0.92 | 0.98 | 0.98 | 0.90 |

REFERENCE SIGNS LIST

1: translucent insulating base plate, 2: surface electrode layer, 3: photoelectric conversion layer, 4: barrier layer, 5: rear surface electrode layer, 10: transparent conductive film, 100: solar cell, a: concave lens-like texture (first texture), b: concave lens-like texture (second texture), Wa: width of concave lens-like texture a, Wb: width of concave lens-like texture b, Ha: depth of concave lens-like texture a, Hb: depth of concave lens-like texture b.

The invention claimed is:

1. A transparent conductive zinc oxide based film, containing Ti, Al and Zn in such a proportion that satisfies formulae (1), (2) and (3) in terms of atomic ratio, and having a plurality of surface textures different in size on a surface,
   a center-line average roughness Ra of the surface being 30 nm to 200 nm, and
   an average value of widths of the surface textures being 100 nm to 10 μm, wherein the formulae are:

$$0.001 \leq Ti/(Zn+Al+Ti) \leq 0.079, \tag{1}$$

$$0.001 \leq Al/(Zn+Al+Ti) \leq 0.079, \text{ and} \tag{2}$$

$$0.010 \leq (Ti+Al)/(Zn+Al+Ti) \leq 0.080. \tag{3}$$

2. The transparent conductive film according to claim 1, wherein a surface area of the transparent conductive film is 101 μm² to 200 μm² per region of 10 μm×10 μm.

3. The transparent conductive film according to claim 1, wherein a shape of the surface textures is a concave lens-like shape.

4. The transparent conductive film according to claim 3, wherein
   the surface textures comprise first textures having a concave lens-like shape and second textures having a concave lens-like shape,
   the second textures are present inside the first textures, an average value of widths of the second textures is smaller than an average value of widths of the first textures, and
   an average value of ratios of widths of the surface textures to depths of the surface textures is 1 to 5.

5. The transparent conductive film according to claim 1, wherein
   a shape of the surface textures is a concave lens-like shape,
   an average value of ratios of widths of the surface textures to depths of the surface textures is 1 to 5, and
   at least part of the plurality of surface textures share a boundary with each other and are randomly arranged.

6. A method for production of the transparent conductive film according to claim 1, comprising:
   forming a film on a heated base material by a sputtering method using a zinc oxide based target containing Ti, Al and Zn in such a proportion that satisfies formulae (1), (2) and (3) in terms of atomic ratio; and
   subjecting a surface of the formed film to a surface treatment, wherein the formulae are:

$$0.001 \leq Ti/(Zn+Al+Ti) \leq 0.079, \tag{1}$$

$$0.001 \leq Al/(Zn+Al+Ti) \leq 0.079, \text{ and} \tag{2}$$

$$0.010 \leq (Ti+Al)/(Zn+Al+Ti) \leq 0.080, \text{ and} \tag{3}$$

wherein a temperature of the heated based material is 250° C. or lower.

7. The method for production according to claim 6, wherein the surface treatment is wet etching using an acid whose hydrogen ion concentration is 0.001 to 0.20 mol/l.

8. The method of claim 6, wherein a temperature of the heated base material is 200° C. or lower.

9. A substrate having a base material, and the transparent conductive film according to claim 1 arranged on the base material.

10. An electron device or optical device comprising the substrate according to claim 9.

11. A photoelectric conversion device comprising the substrate according to claim 9.

12. A solar cell having the transparent conductive film according to claim 1.

13. A transparent conductive zinc oxide based film, produced by a process comprising:
   forming a film on a heated base material by a sputtering method using a zinc oxide based target containing Ti, Al and Zn in such a proportion that satisfies formulae (1), (2) and (3) in terms of atomic ratio; and
   subjecting a surface of the formed film to a surface treatment, wherein the formulae are:

$$0.001 \leq Ti/(Zn+Al+Ti) \leq 0.079, \tag{1}$$

$$0.001 \leq Al/(Zn+Al+Ti) \leq 0.079, \text{ and} \tag{2}$$

$$0.010 \leq (Ti+Al)/(Zn+Al+Ti) \leq 0.080, \text{ and} \tag{3}$$

wherein a temperature of the heated based material is 250° C. or lower.

14. The transparent conductive zinc oxide based film produced by a process of claim 13, wherein a temperature of the heated base is 200° C. or lower.

* * * * *